(12) United States Patent
Punzalan et al.

(10) Patent No.: US 7,378,726 B2
(45) Date of Patent: May 27, 2008

(54) STACKED PACKAGES WITH INTERCONNECTING PINS

(75) Inventors: Nelson V. Punzalan, San Pablo (PH); Lee Sang Ho, Gyounggi-do (KR)

(73) Assignee: Intel Corporation, Santa Clara, CA (US)

( * ) Notice: Subject to any disclaimer, the term of this patent is extended or adjusted under 35 U.S.C. 154(b) by 168 days.

(21) Appl. No.: 11/320,281

(22) Filed: Dec. 28, 2005

(65) Prior Publication Data
US 2007/0145563 A1 Jun. 28, 2007

(51) Int. Cl.
*H01L 23/02* (2006.01)

(52) U.S. Cl. ............... 257/686; 257/685; 257/723; 257/777; 257/E25.006; 257/E25.013; 257/E25.018; 257/E25.021; 257/E25.027; 257/E23.085

(58) Field of Classification Search ........... 257/685, 257/686, 777, E25.006, E25.013, E25.018, 257/E25.021, E25.027, E23.085, E21.614, 257/723–725, 678, 684, 691, 729–734, 773, 257/774, 776, 783, 786–789, 795, 924, E23.079, 257/E23.178, E23.181, E21.502–E21.514; 438/109, FOR. 368, FOR. 426
See application file for complete search history.

(56) References Cited

U.S. PATENT DOCUMENTS 5,241,454 A * 8/1993 Ameen et al. ............... 361/744
6,476,476 B1 * 11/2002 Glenn ........................ 257/686

* cited by examiner

*Primary Examiner*—Jasmine J Clark
(74) *Attorney, Agent, or Firm*—Buckley, Maschoff & Talwalkar LLC

(57) ABSTRACT

A system may include a first integrated circuit package including a first integrated circuit die and a first integrated circuit package substrate defining a first plurality of openings, a second integrated circuit package including a second integrated circuit die and a second integrated circuit package substrate defining a second plurality of openings, and a third substrate comprising a plurality of conductive projections. Each of the plurality of conductive projections may be disposed within a respective one of the first plurality of openings and a respective one of the second plurality of openings.

20 Claims, 10 Drawing Sheets

STACKED PACKAGES WITH INTERCONNECTING PINS

BACKGROUND

Many systems exist for packaging two or more integrated circuit (IC) dice. These multi-die systems provide physical protection to the IC dice, and electrically couple the IC dice to each other and to various external elements. Due to their complexity, fabrication and testing of multi-die systems can be difficult.

A Folded Stack-Chip Scale Package (FS-CSP) attempts to address the foregoing by allowing separate testing of two IC packages prior to coupling. In order to couple the IC packages, a first one of the IC packages is mounted to a first side of a substrate at one end of the substrate. The other end of the substrate is folded over the top of the first IC package to couple the first side of the substrate to the top of the IC package. The second IC package is thereafter coupled to a second side of the substrate above the first IC package.

The folded substrate may present several unsuitable characteristics. First, the folded portion of the substrate exhibits bending stresses that may compromise the integrity of the substrate and of the electrical traces within the substrate. In addition, the relatively long electrical traces within the substrate may exhibit unwanted resistance and resulting voltage drops.

DETAILED DESCRIPTION

Figure 1:
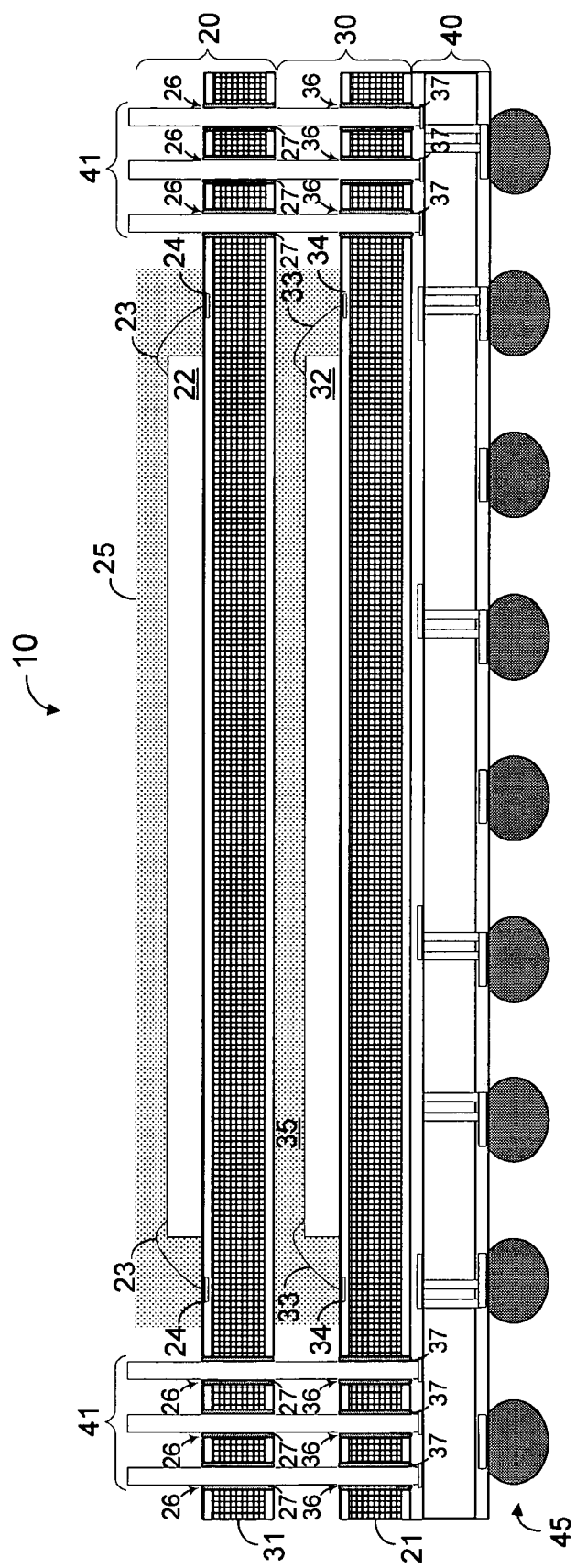
FIG. 1 is a side cross-sectional view of an apparatus according to some embodiments.

FIG. 1 is a cross-sectional side view of apparatus 10 according to some embodiments. Apparatus 10 includes IC package 20, IC package 30 and substrate 40. Apparatus 10 may provide any electronic functionality that is or becomes known.

IC package 20 includes IC package substrate 21 and IC die 22. According to some embodiments, IC die 22 includes integrated electrical devices for providing microprocessor functionality and may be fabricated using any suitable materials and fabrication techniques. The electrical devices of IC die 22 are coupled to IC package substrate 21 via wirebonds 23 and electrical contacts 24. Electrical contacts 24 may, in turn, be connected to conductive vias and traces within IC substrate 21.

IC package substrate 21 may include a base dielectric layer composed of any suitable material, including but not limited to bismalemide triazine (BT) and FR4 in some embodiments. Fabricated on the base layer may be conductive layers separated by additional dielectric layers. The conductive layers comprise reference planes for supplying reference voltages to electrical components that are connected to IC package substrate 21, or routing layers including conductive traces for carrying electrical signals between such electrical components.

IC package substrate 21 defines openings 26. Disposed within each of illustrated openings 26 are one of conductive elements 27 and one of conductive projections 41. Each of conductive elements 27 may comprise conductive plating within a respective opening 26 and each of conductive elements 27 may be electrically connected to one or more conductive layers of IC package substrate 21. In this regard, one or more of conductive elements 27 may be electrically connected to IC die 22.

Mold compound 25 is in contact with IC package substrate 21 and with IC die 22. Mold compound 25 may comprise a stiff material that provides stiffness to IC package 20 and physical protection to IC die 22 and wirebonds 23.

IC package 30 may be constructed similarly to IC package 20 according to some embodiments. For example, IC package 30 includes IC package substrate 31 and IC die 32. IC die 32 may be identical to or different from IC die 22 of IC package 20. IC die 32 may, for instance, comprise a memory die for storing data used by a microprocessor implemented within IC die 22. The electrical devices of IC die 32 are coupled to IC package substrate 31 via wirebonds 33 and electrical contacts 34, and electrical contacts 34 may be connected to conductive vias and traces within IC package substrate 31.

IC package substrate 31 may include dielectric layers and conductive layers sandwiched therebetween. The conductive layers may include conductive traces for carrying electrical signals between IC die 32 and other electrical components. In this regard, one or more of the conductive traces may be electrically connected to one or more of electrical contacts 34.

IC package substrate 31 also defines openings 36. Disposed within each of openings 36 are one of conductive elements 37 and one of conductive projections 41. As described with respect to IC package 20, each of conductive elements 37 may comprise conductive plating within a respective opening 36 and each of conductive elements 37 may be electrically connected to one or more conductive layers of IC package substrate 31. One or more of conductive elements 37 may be thereby electrically connected to IC die 32. IC package 30 also includes mold compound 35 in contact with IC package substrate 31 and with IC die 32.

Aforementioned conductive projections 41 are coupled to substrate 40. More specifically, one or more of conductive projections 41 may be electrically connected to conductive elements of substrate 40. For example, substrate 40 may comprise one or more conductive layers separated by dielectric layers, and one or more of conductive projections 41 may be coupled to one or more of the conductive layers. Substrate 40 may comprise any type of substrate for carrying electrical signals.

Solder balls 45 are coupled to substrate 40 to carry power and other electrical signals between elements of apparatus 10 and external devices. For example, one or more of solder balls 45 may be coupled to conductive elements of substrate 40 and in turn to one or more of conductive projections 41. Solder balls 45 may be mountable directly to a motherboard (not shown) or onto an interposer that is in turn mounted directly to a motherboard. Alternative interconnects such as through-hole pins may be used instead of solder balls 45 to mount apparatus 10 to a motherboard, a socket, or another substrate.

Although depicted in FIG. 1 as being coupled to one of conductive elements 27 and one of conductive elements 37, each of conductive projections 41 may be electrically connected to only one or neither of IC packages 20 and 30. Each of conductive projections 41 may also or alternatively be coupled to one, both or neither of IC die 22 and IC die 32. Moreover, each of IC package 20 and IC package 30 may include more than one IC, and each of conductive projections 41 may be selectively coupled to any number of the IC die. Embodiments are also not limited to two IC packages as shown in FIG. 1.

Figure 2:
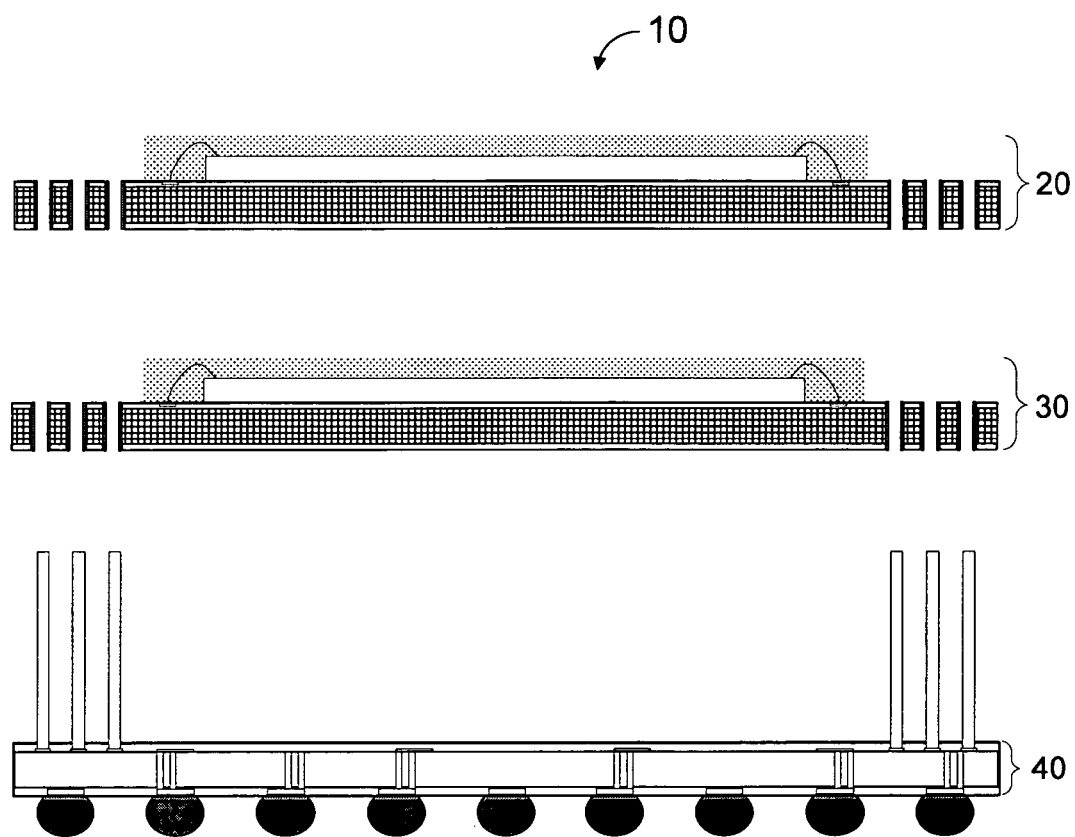
FIG. 2 is an exploded side cross-sectional view of an apparatus according to some embodiments.

FIG. 2 is an exploded cross-sectional side view of apparatus 10. Shown separately are IC package 20, IC package 30 and substrate 40. Again, embodiments are not limited to the structure shown in FIG. 2.

Figure 3:
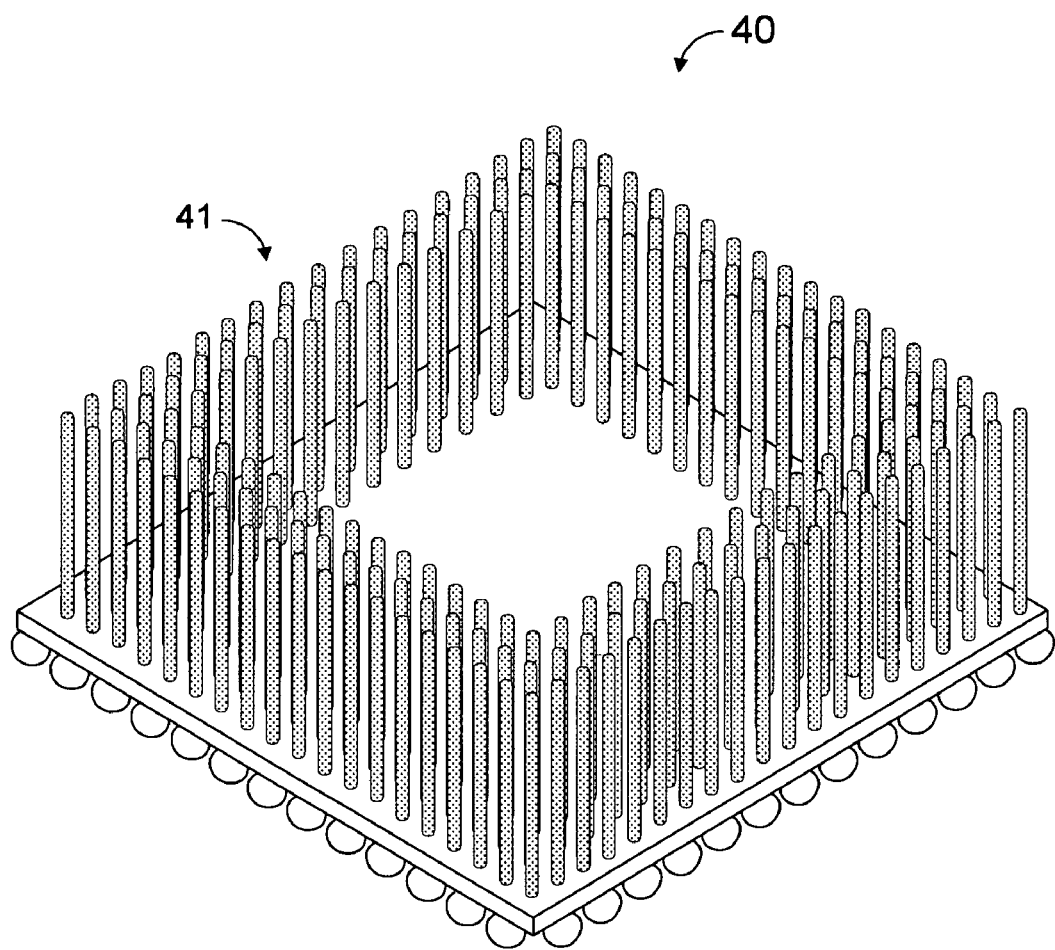
FIG. 3 is a perspective view of a substrate and a plurality of conductive projections according to some embodiments.

A perspective top view of substrate 40 according to some embodiments is shown in FIG. 3. Substrate 40 of FIG. 3 includes several rows of conductive projections 41 to correspond with openings of IC packages to which substrate 40 is to be coupled. Accordingly, any number and configuration of conductive projections 40 may be used in conjunction with some embodiments.

Figure 4:
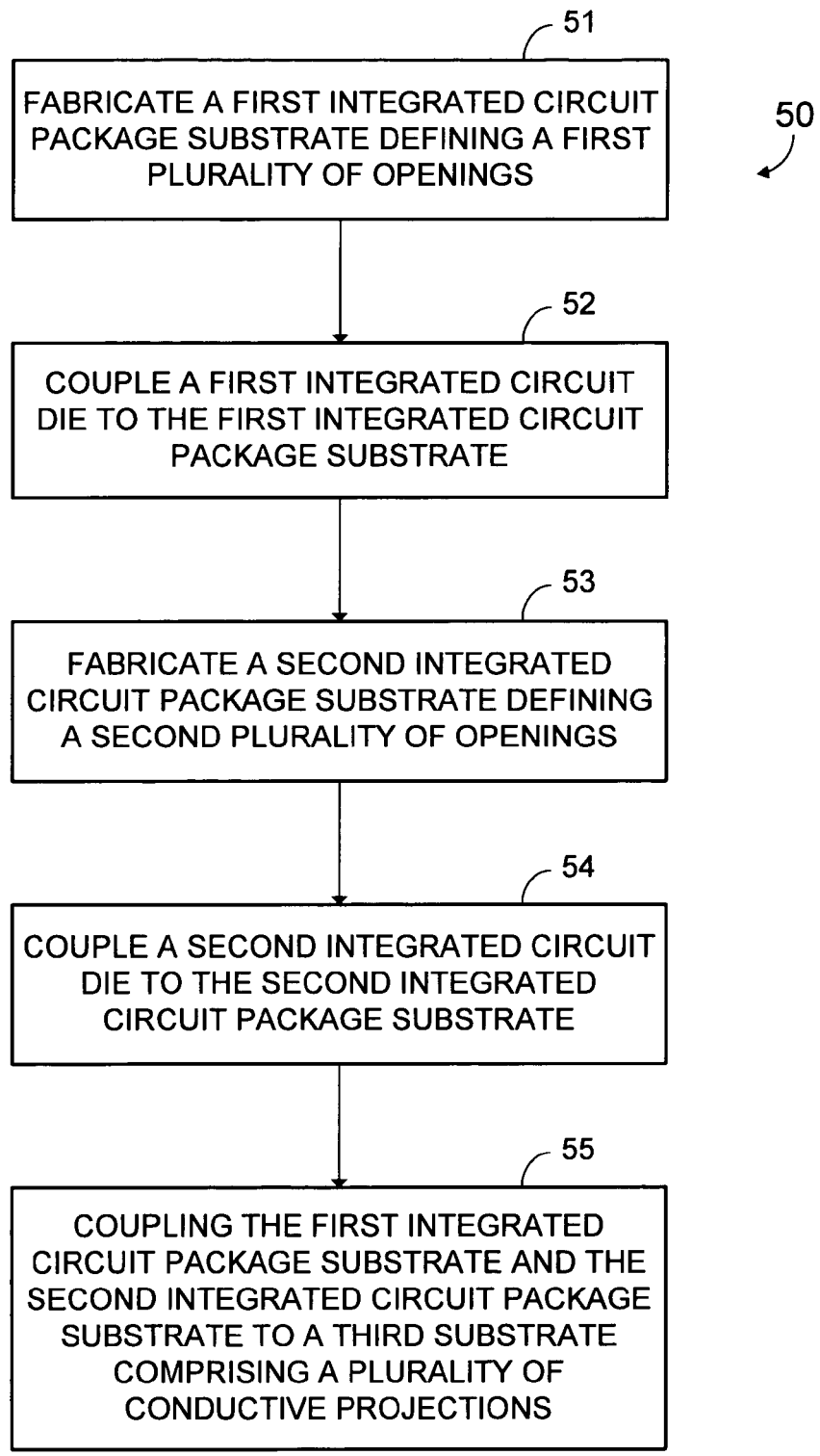
FIG. 4 is a diagram of a process to fabricate the FIG. 1 apparatus according to some embodiments.

FIG. 4 is a diagram of process 50 to fabricate an apparatus according to some embodiments. Process 50 may be executed by one or more devices, and all or a part of process 50 may be executed manually. Process 50 may be executed by an entity different from an entity that manufactures any IC die used therein.

Figure 5A:
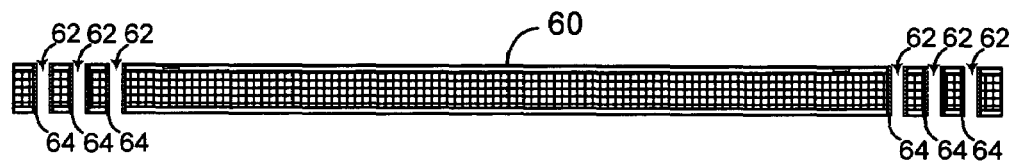
FIGS. 5A through 5E illustrate fabrication of an apparatus according to some embodiments.

Initially, at 51, a first IC package substrate is fabricated. The first IC package substrate defines a first plurality of openings. FIG. 5A is a cross-sectional side view of a first IC package substrate fabricated at 51 according to some embodiments.

As shown, IC package substrate 60 defines openings 62. Each of openings 62 includes a respective conductive element 64. As described with respect to IC package substrates 21 and 31, each conductive element 64 may be electrically connected to one or more conductive traces of IC package substrate 60.

IC package substrate 60 may be fabricated at 50 using any techniques that are or become known. In some embodiments, such fabrication includes depositing alternating dielectric and conductive layers, laser drilling or etching the resulting structure to create openings 62, and plating the openings to create conductive elements 64.

Figure 5B:
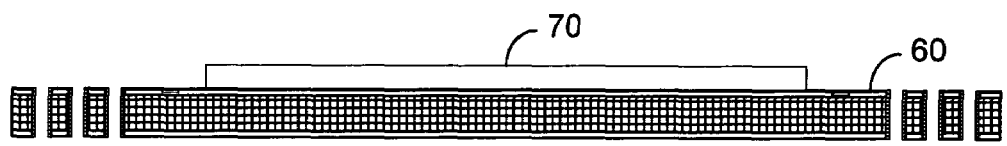
Figure 5C:
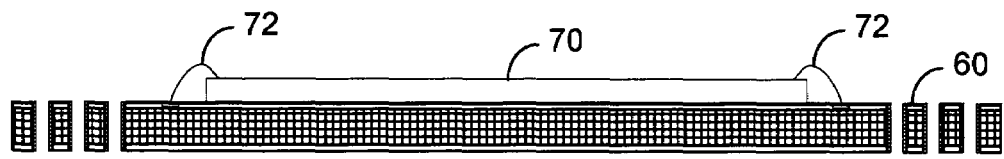
Figure 5D:
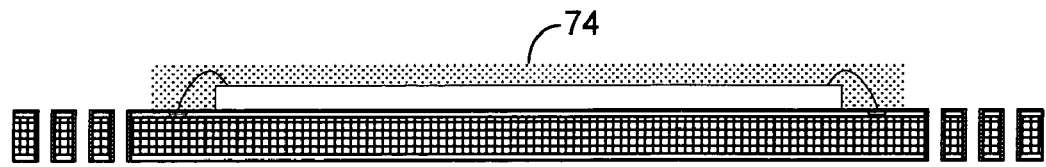

A first IC die is coupled to the IC package substrate at 52. The IC die may provide any suitable functions and may itself be fabricated using any suitable materials and processes. FIG. 5B shows IC die 70 coupled to IC substrate 60 according to some embodiments of 52. In some embodiments, die attach film is used to couple die 70 to substrate 60. FIG. 5C shows wirebonds 72 that may be attached to IC die 70 and substrate 60 at 52, and FIG. 5D shows the addition of mold compound 74 according to a further alternative of 52. Wirebonding and depositing of mold compound may proceed according to any currently- or hereafter-known systems.

A second IC package substrate defining a second plurality of openings is fabricated at 53 and a second IC die is coupled to the second IC package substrate at 54. 53 and 54 may therefore proceed as described above with respect to 51 and 52. The second IC package substrate may, however, be fabricated using a different process than that used to fabricate the first IC package substrate, and the second IC die may be coupled to the second IC package substrate in a manner different from the coupling of the first IC die to the first IC package substrate.

Next, at 55, the first IC package substrate and the second IC package substrate are coupled to a third substrate. The third substrate comprises a plurality of conductive projections. The plurality of conductive projections may themselves be fabricated on the third substrate using any suitable technique, including but not limited to current techniques for coupling conductive pins to an IC package substrate.

Figure 5E:
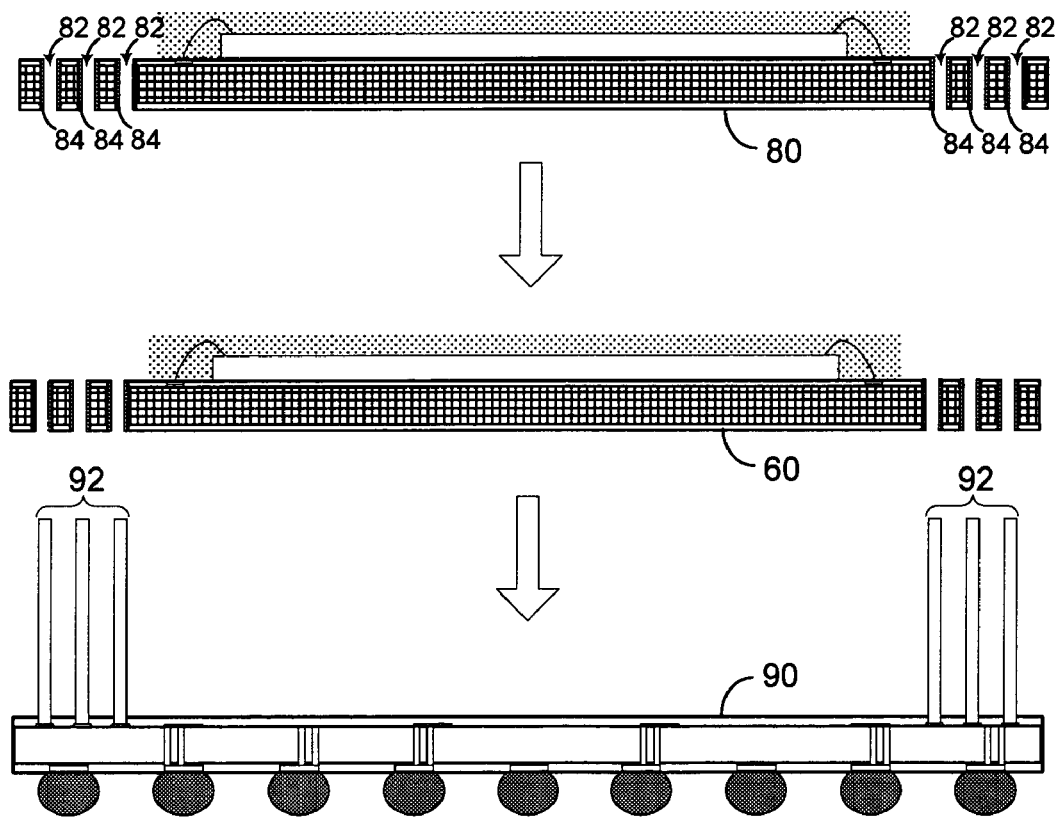

FIG. 5E illustrates 55 according to some embodiments. In particular, first IC package substrate 60 and second IC package substrate 80 are shown being coupled to substrate 90 including conductive projections 92. Such coupling may comprise using a pick-and-place machine to align each of conductive projections 92 with corresponding ones of openings 62 and 82 and to lower IC package substrate 60 and IC package substrate 80 thereon.

Coupling the first, second and third substrates at 55 may also comprise the use of adhesives not shown in FIG. 5E. The elements of FIG. 5E may also or alternatively be heated after 55 to reflow solder within openings 62 and 82 and to therefore improve electrical interconnection between conductive projections 92 and conductive elements 64 and 84.

Figure 6A:
FIGS. 6A through 6G illustrate fabrication of an apparatus according to some embodiments.
Figure 6B:
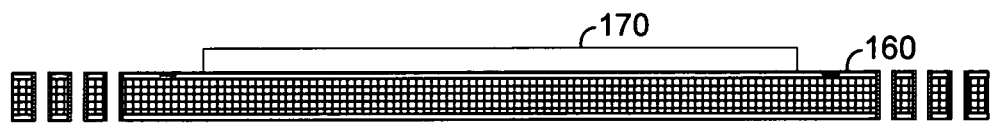
Figure 6C:
Figure 6D:
Figure 6E:
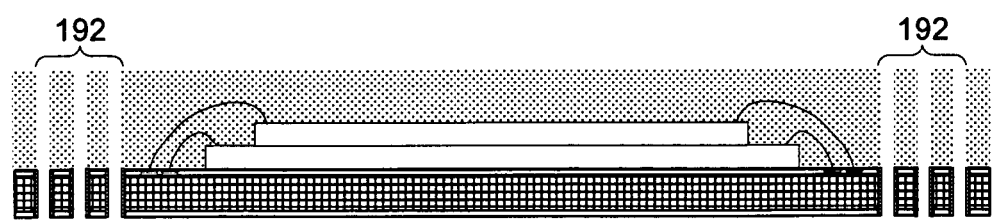

FIGS. 6A through 6G illustrate process 50 according to some embodiments. FIGS. 6A and 6B are similar to FIGS. 5A and 5B, but FIGS. 6C and 6D show the coupling of second IC die 180 to the first IC package substrate at 52. Also occurring at 52 according to the illustrated embodiment is the deposition of mold compound 190 including openings 192.

Openings 192 may be formed by casting mold compound 190 within a tool (i.e. a die) including projections corresponding to openings 192. Mold compound 190 may be partially hardened within such a tool, removed therefrom, and then deposited on substrate 160, IC die 170 and IC die 180.

Figure 6F:
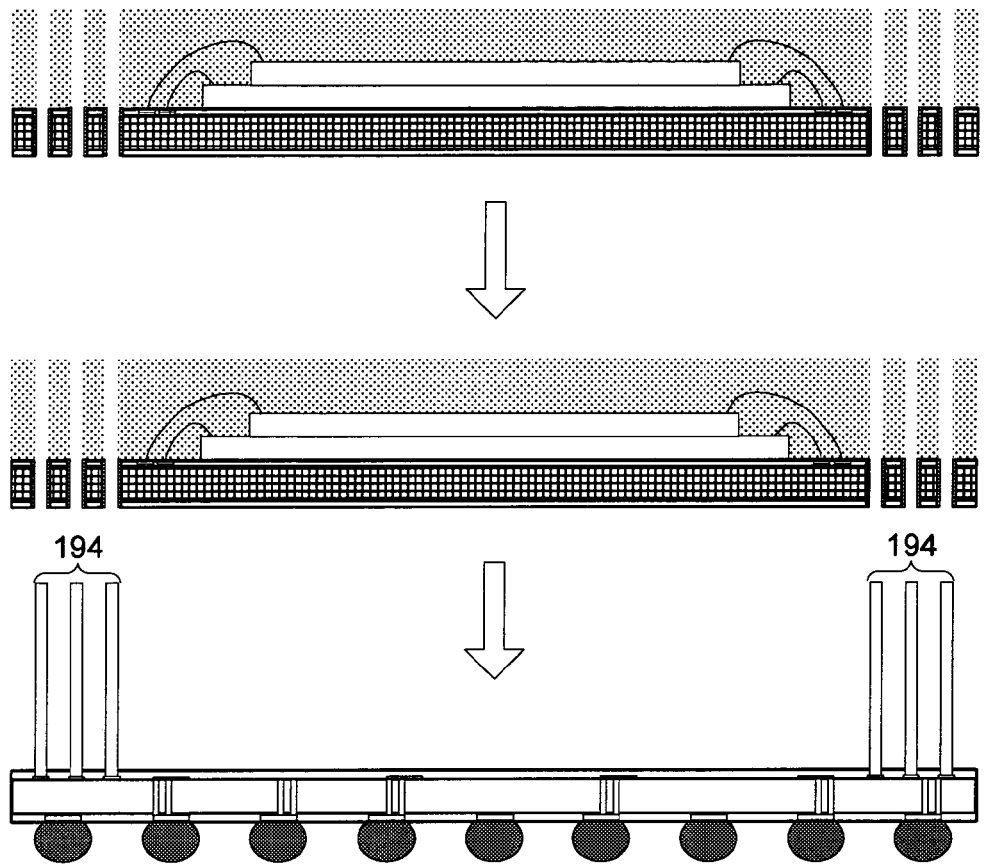
Figure 6G:
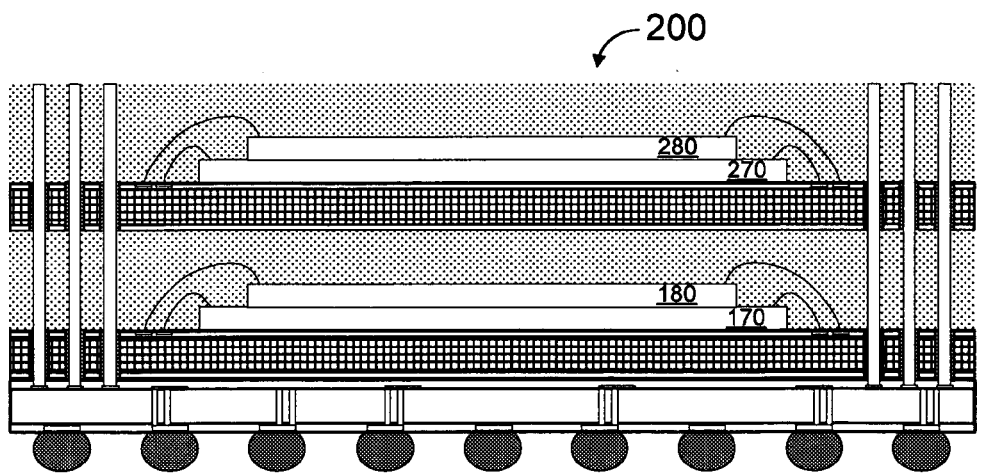

FIG. 6F illustrates 55 according to the present example, and assuming that 53 and 54 have proceeded as shown in FIGS. 6A through 6E. FIG. 6G is a cross-sectional view of fabricated apparatus 200, in which conductive projections 194 have been received in respective ones of openings 192 and openings of the first and second IC package substrates. According to some embodiments, IC die 170 comprises a microprocessor, IC die 180 comprises a Static Random Access Memory, IC die 270 comprises flash memory, and IC die 280 comprises flash memory.

Figure 7:
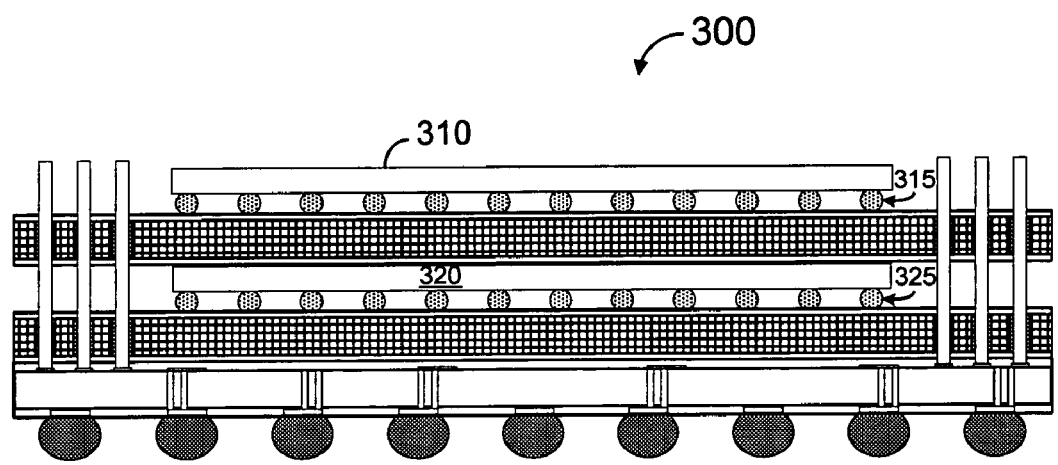
FIG. 7 is a side cross-sectional view of an apparatus according to some embodiments.

FIG. 7 is a cross-sectional side view of apparatus 300 according to some embodiments. Apparatus 300 is similar to apparatus 10 but does not include any wirebonds or mold compound. Rather, IC die 310 and IC die 320 of apparatus 300 comprise a "flip-chip" arrangement. Specifically, integrated electrical devices of IC die 310 and IC die 320 reside between their respective (e.g., silicon) substrates and Controlled Collapse Chip Connect (C4) solder bumps 315 and 325. Again, IC die 310 may provide functionality different from that provided by IC die 320.

Figure 8:
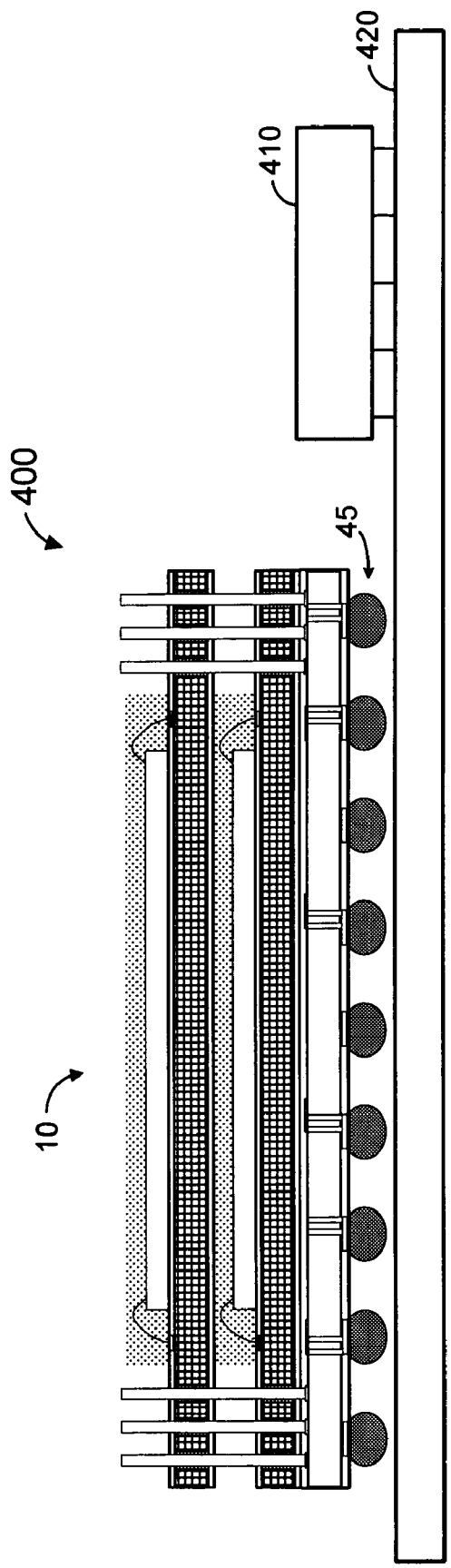
FIG. 8 is a diagram of a system according to some embodiments.

FIG. 8 is a cross-sectional side view of system 400 according to some embodiments. System 400 may comprise components of a server platform. System 400 includes apparatus 10 as described above, graphics controller 410 and motherboard 420. Apparatus 10 may comprise a microprocessor die and a memory die.

Motherboard 420 may electrically couple graphics controller 410 to apparatus 10. More particularly, motherboard 420 may comprise a bus (not shown) that is electrically coupled to solder balls 45 and to graphics controller 410.

Graphics controller 410 may comprise any type of graphics controller, including but not limited to an IC package, an expansion card, and other devices supporting any type of graphics format.

Some embodiments of the foregoing features may provide at least one of increased reliability, reduced voltage drop throughout apparatus, detachability of individual IC packages after manufacture, and increased flexibility to manufacture different products from interchangeable parts.

The several embodiments described herein are solely for the purpose of illustration. The various features described herein need not all be used together, and any one or more of those features may be incorporated in a single embodiment. Some embodiments may include any currently or hereafter-known versions of the elements described herein. Therefore, other embodiments may be practiced with various modifications and alterations.

What is claimed is:

1. An apparatus comprising:
    a first integrated circuit package comprising a first integrated circuit die and a first integrated circuit package substrate, the first integrated circuit package substrate defining a first plurality of openings;
    a second integrated circuit package comprising a second integrated circuit die and a second integrated circuit package substrate, the second integrated circuit package substrate defining a second plurality of openings; and
    a third substrate comprising a plurality of conductive projections,
    wherein each of the plurality of conductive projections is disposed within a respective one of the first plurality of openings and a respective one of the second plurality of openings;
    wherein one of the plurality of conductive projections contacts a first conductive element of the first integrated circuit package and a second conductive element of the second integrated circuit package;
    wherein the first conductive element is electrically connected to the first integrated circuit die and the second conductive element is electrically connected to the second integrated circuit die;
    wherein the third substrate comprises a plurality of solder balls, and
    wherein the one of the plurality of conductive projections is electrically connected to one of the plurality of solder balls.

2. An apparatus comprising:
    a first integrated circuit package comprising a first integrated circuit die and a first integrated circuit package substrate, the first integrated circuit package substrate defining a first plurality of openings;
    a second integrated circuit package comprising a second integrated circuit die and a second integrated circuit package substrate, the second integrated circuit package substrate defining a second plurality of openings; and
    a third substrate comprising a plurality of conductive projections,
    wherein each of the plurality of conductive projections is disposed within a respective one of the first plurality of openings and a respective one of the second plurality of openings;
    wherein the first integrated circuit package comprises a third integrated circuit die, and
    wherein the first integrated circuit die comprises a microprocessor and the third integrated circuit die comprises static random access memory.

3. An apparatus according to claim 2,
    wherein the second integrated circuit package comprises a fourth integrated circuit die, and
    wherein the second integrated circuit die comprises flash memory and the fourth integrated circuit die comprises flash memory.

4. An apparatus comprising:
    a first integrated circuit package comprising a first integrated circuit die and a first integrated circuit package substrate, the first integrated circuit package substrate defining a first plurality of openings;
    a second integrated circuit package comprising a second integrated circuit die and a second integrated circuit package substrate, the second integrated circuit package substrate defining a second plurality of openings; and
    a third substrate comprising a plurality of conductive projections,
    wherein each of the plurality of conductive projections is disposed within a respective one of the first plurality of openings and a respective one of the second plurality of openings;
    wherein the first integrated circuit package comprises a first plurality of wirebonds to connect the first integrated circuit die to the first integrated circuit package substrate,
    wherein the second integrated circuit package comprises a second plurality of wirebonds to connect the second integrated circuit die to the second integrated circuit package substrate.

5. An apparatus according to claim 4, further comprising:
    first mold compound disposed over the first integrated circuit die and the first plurality of wirebonds; and
    second mold compound disposed over the second integrated circuit die and the second plurality of wirebonds.

6. An apparatus according to claim 5,
    wherein the first mold compound defines a third plurality of openings,
    wherein the second mold compound defines a fourth plurality of openings, and
    wherein each of the plurality of conductive projections is disposed within a respective one of the third plurality of openings and a respective one of the fourth plurality of openings.

7. An apparatus comprising:
    a first integrated circuit package comprising a first integrated circuit die and a first integrated circuit package substrate, the first integrated circuit package substrate defining a first plurality of openings;
    a second integrated circuit package comprising a second integrated circuit die and a second integrated circuit package substrate, the second integrated circuit package substrate defining a second plurality of openings; and
    a third substrate comprising a plurality of conductive projections,
    wherein each of the plurality of conductive projections is disposed within a respective one of the first plurality of openings and a respective one of the second plurality of openings;
    wherein the plurality of conductive projections are disposed on a first face of the third substrate, wherein the third substrate comprises a plurality of solder balls disposed on a second face of the third substrate, and wherein at least one of the plurality of conductive projections is electrically connected to one of the plurality of solder balls.

8. A method comprising:

fabricating a first integrated circuit package substrate defining a first plurality of openings;

coupling a first integrated circuit die to the first integrated circuit package substrate;

fabricating a second integrated circuit package substrate defining a second plurality of openings;

coupling a second integrated circuit die to the second integrated circuit package substrate; and coupling the first integrated circuit package substrate and the second integrated circuit package substrate to a third substrate comprising a plurality of conductive projections, wherein each of the plurality of conductive projections is coupled to a respective one of the first plurality of openings and to a respective one of the second plurality of openings;

wherein one of the plurality of conductive projections contacts a first conductive element of the first integrated circuit package and a second conductive element of the second integrated circuit package;

wherein the first conductive element is electrically connected to the first integrated circuit die and the second conductive element is electrically connected to the second integrated circuit die;

wherein the third substrate comprises a plurality of solder balls, and wherein the one of the plurality of conductive projections is electrically connected to one of the plurality of solder balls.

9. A method comprising:

fabricating a first integrated circuit package substrate defining a first plurality of openings;

coupling a first integrated circuit die to the first integrated circuit package substrate;

fabricating a second integrated circuit package substrate defining a second plurality of openings;

coupling a second integrated circuit die to the second integrated circuit package substrate;

coupling the first integrated circuit package substrate and the second integrated circuit package substrate to a third substrate comprising a plurality of conductive projections, and coupling a third integrated circuit die to the first integrated circuit die, wherein each of the plurality of conductive projections is coupled to a respective one of the first plurality of openings and to a respective one of the second plurality of openings; and wherein the first integrated circuit die comprises a microprocessor and the third integrated circuit die comprises static random access memory.

10. A method according to claim 9, further comprising:

coupling a fourth integrated circuit die to the second integrated circuit die, wherein the second integrated circuit die comprises flash memory and the fourth integrated circuit die comprises flash memory.

11. A method comprising:

fabricating a first integrated circuit package substrate defining a first plurality of openings;

coupling a first integrated circuit die to the first integrated circuit package substrate;

fabricating a second integrated circuit package substrate defining a second plurality of openings;

coupling a second integrated circuit die to the second integrated circuit package substrate;

coupling the first integrated circuit package substrate and the second integrated circuit package substrate to a third substrate comprising a plurality of conductive projections, connecting a first plurality of wirebonds to the first integrated circuit die and to the first integrated circuit package substrate; and connecting a second plurality of wirebonds to the second integrated circuit die and to the second integrated circuit package substrate;

wherein each of the plurality of conductive projections is coupled to a respective one of the first plurality of openings and to a respective one of the second plurality of openings.

12. A method according to claim 11, further comprising:

depositing first mold compound over the first integrated circuit die and the first plurality of wirebonds; and depositing second mold compound disposed over the second integrated circuit die and the second plurality of wirebonds.

13. A method according to claim 12, wherein the first mold compound defines a third plurality of openings, wherein the second mold compound defines a fourth plurality of openings, and wherein each of the plurality of conductive projections is disposed within a respective one of the third plurality of openings and a respective one of the fourth plurality of openings.

14. A method comprising:

fabricating a first integrated circuit package substrate defining a first plurality of openings;

coupling a first integrated circuit die to the first integrated circuit package substrate;

fabricating a second integrated circuit package substrate defining a second plurality of openings;

coupling a second integrated circuit die to the second integrated circuit package substrate; and coupling the first integrated circuit package substrate and the second integrated circuit package substrate to a third substrate comprising a plurality of conductive projections, wherein each of the plurality of conductive projections is coupled to a respective one of the first plurality of openings and to a respective one of the second plurality of openings;

wherein the plurality of conductive projections are disposed on a first face of the third substrate, wherein the third substrate comprises a plurality of solder balls disposed on a second face of the third substrate, and wherein at least one of the plurality of conductive projections is electrically connected to one of the plurality of solder balls.

15. A system comprising:

a microprocessor die;

a first integrated circuit package substrate coupled to the microprocessor die, the first integrated circuit package substrate defining a first plurality of openings;

a memory die;

a second integrated circuit package substrate coupled to the memory die, the second integrated circuit package substrate defining a second plurality of openings;

a third substrate comprising a plurality of conductive projections, each of the plurality of conductive projections being disposed within a respective one of the first plurality of openings and a respective one of the second plurality of openings;

a motherboard connected to the third substrate; and a graphics controller connected to the motherboard.

16. A system according to claim 15, wherein one of the plurality of conductive projections contacts a first conductive element of the first integrated circuit package and a second conductive element of the second integrated circuit package.

17. A system according to claim 16, wherein the first conductive element is electrically connected to the microprocessor die and the second conductive element is electrically connected to the memory die.

18. A system according to claim 15, further comprising:

a second memory die coupled to the microprocessor.

19. A system according to claim 15, further comprising:

a first plurality of wirebonds connecting the microprocessor die to the first integrated circuit package substrate;

a second plurality of wirebonds connecting the memory die to the second integrated circuit package substrate;

first mold compound disposed over the microprocessor die and the first plurality of wirebonds; and second mold compound disposed over the memory die and the second plurality of wirebonds.

20. A system according to claim 19, wherein the first mold compound defines a third plurality of openings, wherein the second mold compound defines a fourth plurality of openings, and wherein each of the plurality of conductive projections is disposed within a respective one of the third plurality of openings and a respective one of the fourth plurality of openings.

* * * * *